United States Patent
Park et al.

(10) Patent No.: US 10,879,486 B2
(45) Date of Patent: Dec. 29, 2020

(54) DISPLAY DEVICE

(71) Applicant: LG DISPLAY CO., LTD., Seoul (KR)

(72) Inventors: Joon-Min Park, Seoul (KR); SungJin Hong, Seoul (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 16/504,011

(22) Filed: Jul. 5, 2019

(65) Prior Publication Data

US 2020/0013985 A1 Jan. 9, 2020

(30) Foreign Application Priority Data

Jul. 6, 2018 (KR) .................... 10-2018-0078973

(51) Int. Cl.
*H01L 51/52* (2006.01)
*H01L 27/32* (2006.01)

(52) U.S. Cl.
CPC ...... *H01L 51/5209* (2013.01); *H01L 27/3258* (2013.01); *H01L 27/322* (2013.01); *H01L 27/3246* (2013.01)

(58) Field of Classification Search
CPC ............ H01L 51/5209; H01L 27/3258; H01L 27/3246; H01L 27/322
See application file for complete search history.

(56) References Cited

U.S. PATENT DOCUMENTS

| 2005/0110021 A1* | 5/2005 | Park | H01L 27/3246 257/72 |
| 2015/0340414 A1* | 11/2015 | Choi | H01L 27/3246 257/40 |
| 2015/0349029 A1* | 12/2015 | Choi | H01L 33/44 257/40 |

* cited by examiner

*Primary Examiner* — Kyoung Lee
(74) *Attorney, Agent, or Firm* — Birch, Stewart, Kolasch & Birch, LLP

(57) ABSTRACT

In a display device, an edge portion of a pixel electrode is modified. A valley is provided in an overcoat layer located below the pixel electrode. The edge portion of the pixel electrode is configured to be curved or bent onto the overcoat layer. As a result, the aperture ratio of the display device can be increased, and an image abnormality in the edge portion of the pixel electrode can be prevented.

13 Claims, 20 Drawing Sheets

DISPLAY DEVICE

CROSS REFERENCE TO RELATED APPLICATION

This application claims priority to Korean Patent Application No. 10-2018-0078973, filed in the Republic of Korea on Jul. 6, 2018, which is hereby incorporated by reference for all purposes as if fully set forth herein.

BACKGROUND

Field

Exemplary embodiments relate to a display device.

Description of Related Art

With the development of the information society, there has been increasing demand for a variety of image display devices. A range of display devices, such as liquid crystal display (LCD) devices, plasma display devices, and organic light-emitting diode (OLED) display devices, have recently come into widespread use.

Such a display device can include a display panel in which a plurality of subpixels are arrayed and driving circuits for driving the display panel.

A plurality of subpixels can be disposed in the display panel to display images. Banks corresponding to separation ribs defining an emission area of each of the subpixels can be disposed in the display panel. When the banks are disposed on the display panel, the aperture ratio of the display panel can be reduced, which is problematic. However, in the related art, there has been no substantial solution to increase the aperture ratio of the display panel.

BRIEF SUMMARY

Various aspects of the present disclosure provide a display device having a structure able to efficiently increase the aperture ratio of the display device.

Also provided is a display device having a structure able to prevent an image abnormality in an edge portion of a pixel electrode, while increasing the aperture ratio of the display device.

Also provided is a display device having a full bankless structure able to prevent an image abnormality in an edge portion of a pixel electrode, while increasing the aperture ratio of the display device.

Also provided is a display device having a hybrid bankless structure able to prevent an image abnormality in an edge portion of a pixel electrode, while increasing the aperture ratio of the display device.

Also provided is a display device having a structure able to improve luminous efficiency by reducing unnecessary total internal reflection of light.

According to an aspect of the present disclosure, a display device can include a substrate; an overcoat layer disposed on the substrate; and a first pixel electrode disposed on the overcoat layer. The first pixel electrode can be located in an area of a first subpixel.

In the display device, the overcoat layer can have a recessed first valley.

An edge portion of the first pixel electrode can have a curved or bent portion located on a portion of the first valley of the overcoat layer.

The display device can further include a second pixel electrode disposed on the overcoat layer and spaced apart from the first pixel electrode.

The overcoat layer can include a recessed second valley, the second valley being spaced apart from the first valley. An edge portion of the second pixel electrode can have a curved or bent portion located on a portion of the second valley of the overcoat layer.

The distance between a mouth of the first valley of the overcoat layer and a mouth of the second valley of the overcoat layer can be shorter than the distance between the first pixel electrode and the second pixel electrode.

The first valley of overcoat layer can be located along an outer boundary of first pixel electrode, and the second valley of overcoat layer can be located along an outer boundary of second pixel electrode.

An entire area of each of the first pixel electrode and the second pixel electrode can be contact with a corresponding organic light-emitting layer.

The display device can further include a second pixel electrode disposed on the overcoat layer to be spaced apart from the first pixel electrode in a row direction. The first valley of the overcoat layer can be located between the edge portion of the first pixel electrode and an edge portion of the second pixel electrode.

The width of a mouth of the first valley of the overcoat layer can be greater than the distance between the first pixel electrode and the second pixel electrode.

The edge portion of the second pixel electrode can have a curved or bent portion located on another portion of the first valley of the overcoat layer.

The edge portion of the first pixel electrode and the edge portion of the second pixel electrode can face each other. Another edge portion of the first pixel electrode and another portion of the second pixel electrode can be located parallel to each other.

The display device can further include a bank located on the other edge portion of the first pixel electrode and the other edge portion of the second pixel electrode.

The display device can further include a transistor electrically connected to the first pixel electrode or the second pixel electrode and located below the overcoat layer, in an area in which the bank is located. A source or a drain of the transistor can be electrically connected to the first pixel electrode or the second pixel electrode through a hole in the overcoat layer.

The display device can further include a third pixel electrode disposed on the overcoat layer to be spaced apart from the first pixel electrode in a column direction. The first valley of the overcoat layer can be located between the edge portion of the first pixel electrode and an edge portion of the third pixel electrode.

The width of a mouth of the first valley of the overcoat layer can be greater than the distance between the first pixel electrode and the third pixel electrode.

The edge portion of the third pixel electrode can have a curved or bent portion located on another portion of the first valley of the overcoat layer.

The edge portion of the first pixel electrode and the edge portion of the third pixel electrode can face each other. Another edge portion of the first pixel electrode and another portion of the third pixel electrode can be located parallel to each other. The display device can further include a bank located on the other edge portion of the first pixel electrode and the other edge portion of the third pixel electrode.

The display device can further include a transistor electrically connected to the first pixel electrode or the third pixel electrode and located below the overcoat layer, in an area in which the bank is located. A source or a drain of the transistor can be electrically connected to the first pixel electrode or the third pixel electrode through a hole in the overcoat layer.

The display device can further include a color filter disposed below the overcoat layer, the color filter corresponding to a color of the first subpixel.

Totally-reflected light can be present below the first pixel electrode. The intensity of the totally-reflected light, present below the curved or bent portion of the first pixel electrode on the portion of the first valley, can be lower than the intensity of the totally-reflected light, present below a flat portion of the first pixel electrode.

According to another aspect, a display device can include a substrate; an overcoat layer disposed on the substrate; and a first pixel electrode disposed on the overcoat layer. The first pixel electrode can be located in an area of a first subpixel.

An edge portion of the first pixel electrode can be positively tapered or rounded. The display device can further include an organic light-emitting layer disposed on the edge portion of the first pixel electrode.

According to exemplary embodiments, the display device has a structure able to efficiently increase the aperture ratio of the display device.

According to exemplary embodiments, the display device has a structure able to prevent an image abnormality in an edge portion of a pixel electrode, while increasing the aperture ratio of the display device.

According to exemplary embodiments, the display device has a full bankless structure able to prevent an image abnormality in an edge portion of a pixel electrode, while increasing the aperture ratio of the display device.

According to exemplary embodiments, the display device has a hybrid bankless structure able to prevent an image abnormality in an edge portion of a pixel electrode, while increasing the aperture ratio of the display device.

According to exemplary embodiments, the display device has a structure able to improve luminous efficiency by reducing unnecessary total internal reflection of light.

DESCRIPTION OF DRAWINGS

The above and other objects, features, and advantages of the present disclosure will be more clearly understood from the following detailed description, taken in conjunction with the accompanying drawings, in which.

DETAILED DESCRIPTION

Figure 1:
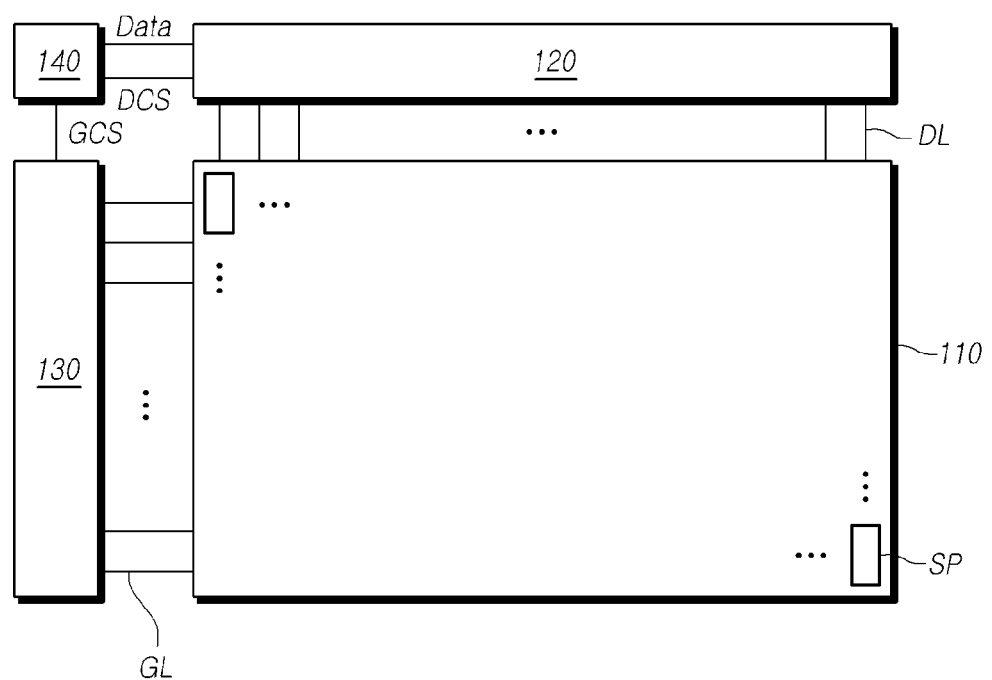
FIG. 1 illustrates a schematic system configuration of a display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the case that the subject matter of the present disclosure can be rendered unclear thereby.

It will also be understood that, while terms, such as "first," "second," "A," "B," "(a)," and "(b)," can be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

FIG. 1 illustrates a schematic system configuration of a display device 100 according to exemplary embodiments. All the components of the display device according to all embodiments are operatively coupled and configured.

Referring to FIG. 1, the display device 100 according to exemplary embodiments can include a display panel 110, in which a plurality of data lines DL and a plurality of gate lines GL are disposed, and a plurality of subpixels SP defined by the plurality of data lines DL and the plurality of gate lines GL are arrayed in the form of a matrix, and a driving circuit driving the display panel 110.

The driving circuit, in terms of the function, can include a data driver circuit 120 driving the plurality of data lines DL, a gate driver circuit 130 driving the plurality of gate lines GL, a controller 140 controlling the data driver circuit 120 and the gate driver circuit 130, etc.

In the display panel 110, the plurality of data lines DL and the plurality of gate lines GL can intersect each other. For example, the plurality of gate lines GL can be disposed in rows or columns, while the plurality of data lines DL can be disposed in columns or rows.

In the display panel 110, other types of lines can be disposed, in addition to the plurality of data lines DL and the plurality of gate lines GL.

The controller 140 can supply image data DATA to the data driver circuit 120.

In addition, the controller 140 can control the operations of the data driver circuit 120 and gate driver circuit 130 by transferring a variety of control signals DCS and GCS, necessary for driving of the data driver circuit 120 and gate driver circuit 130, to the data driver circuit 120 and gate driver circuit 130.

The controller 140 can be a timing controller used in typical display technology, or can be a control device including a timing controller and performing other control functions.

The controller 140 can be provided as a component separate from the data driver circuit 120, or can be provided in combination with data driver circuit 120 to form an integrated circuit (IC).

The data driver circuit 120 receives image data from the controller 140 and supplies data voltages to the plurality of data lines DL to drive the plurality of data lines DL. Herein, the data driver circuit 120 can also be referred to as a source driver circuit.

The data driver circuit 120 can include a shift register, a latch circuit, a digital-to-analog converter (DAC), an output buffer, etc., as applicable.

The data driver circuit 120 can further include one or more analog-to-digital converter (ADC), as required.

The gate driver circuit 130 sequentially drives the plurality of gate lines GL by sequentially supplying a scan signal to the plurality of gate lines GL. Herein, the gate driver circuit 130 can also be referred to as a scan driver circuit.

The gate driver circuit 130 can include a shift register, a level shifter, etc.

The gate driver circuit 130 sequentially supplies the scan signal having an on or off voltage to the plurality of gate lines GL, under the control of the controller 140.

When a specific gate line is opened by the gate driver circuit 130, the data driver circuit 120 converts the image data DATA, received from the controller 140, into analog data voltages, and supplies the data voltages to the plurality of data lines DL.

The data driver circuit 120 can be disposed on one side of the display panel 110 (e.g., above or below the display panel 110). In some cases, the data driver circuit 120 can be disposed on both sides of the display panel 110 (e.g., above and below the display panel 110), depending on the driving system, the design of the panel, etc.

The gate driver circuit 130 can be disposed on one side of the display panel 110 (e.g., to the right or left of the display panel 110). In some cases, the gate driver circuit 130 can be disposed on both sides of the display panel 110 (e.g., to the right and left of the display panel 110), depending on the driving system, the design of the panel, etc.

The data driver circuit 120 can include one or more source driver ICs (SDIC).

Each of the source driver ICs can be connected to a bonding pad of the display panel 110 by a tape-automated bonding (TAB) method or a chip-on-glass (COG) method, or can be directly mounted on the display panel DISP. In some cases, each of the source driver ICs can be integrated with the display panel 110. In addition, each of the source driver ICs can be implemented using a chip-on-film (COF) structure. In this case, the source driver ICs can be mounted on circuit films to be electrically connected to the data lines DL in the display panel 110 via the circuit films.

The gate driving circuit 130 can include one or more gate driver ICs (GDICs), each of which is connected to a bonding pad of the display panel 110 by a TAB method or a COG method. The gate driving circuit 130 can be implemented using a gate-in-panel (GIP) structure directly mounted on the display panel 110. Alternatively, the gate driving circuit 130 can be implemented using a COF structure. In this case, the gate driver ICs of the gate driving circuit 130 can be mounted on circuit films to be electrically connected to the gate lines GL in the display panel 110 via the circuit films.

The display device 100 according to exemplary embodiments can be one of various types of display device, such as an organic light-emitting display device or a liquid crystal display (LCD) device.

Figure 2:
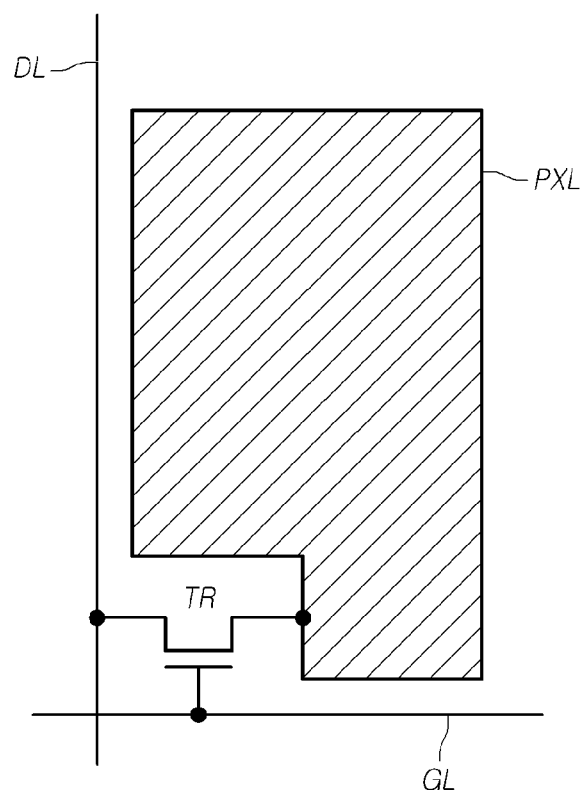
FIG. 2 illustrates a subpixel structure of the display device according to exemplary embodiments.

FIG. 2 illustrates a subpixel structure of the display device 100 according to exemplary embodiments.

Referring to FIG. 2, in a case in which the display device 100 according to exemplary embodiments is an organic light-emitting display device, each of the subpixels SP arrayed in the display panel 110 can be defined by a data line DL and a gate line GL, and include a transistor TR, a pixel electrode PXL, etc. PA The transistor TR can include a gate node electrically connected to the gate line GL such that a scan signal is applied thereto, a source node (or a drain node) electrically connected to the data line DL such that a data voltage is applied thereto, and a drain node (or a source node) electrically connected to the pixel electrode PXL.

The data voltage (or pixel voltage), supplied from the data line DL, can be applied to the pixel electrode PXL through the transistor TR.

In addition, a common electrode, to which a common voltage is applied, can be disposed in the display panel 110, and a capacitor can be provided between the common electrode and the pixel electrode PXL.

Figure 3:
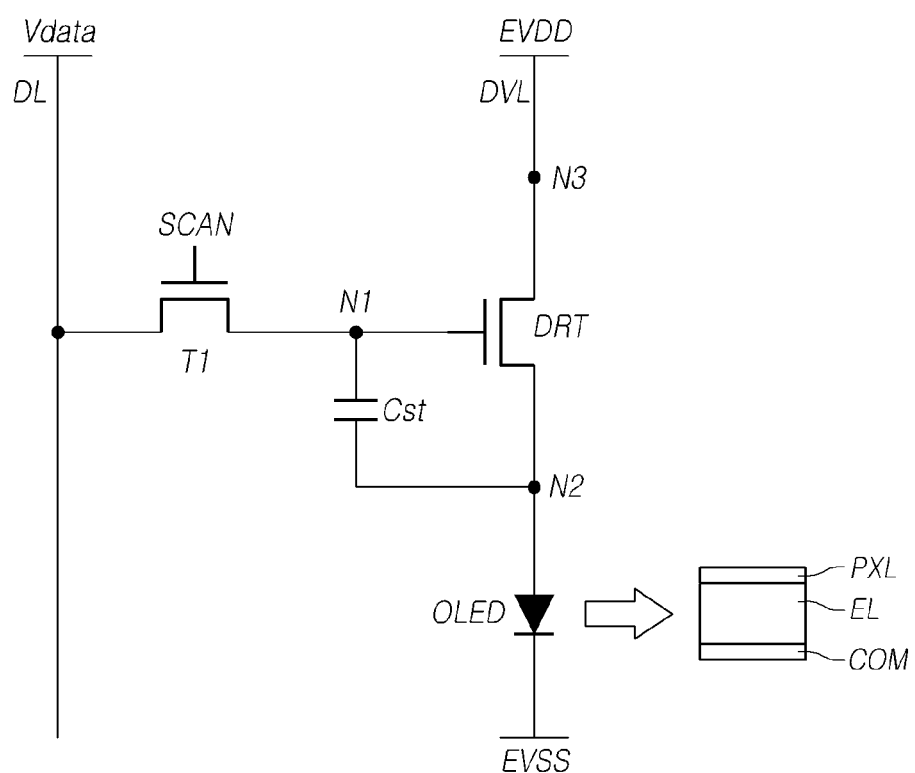
FIG. 3 illustrates another subpixel structure of the display device according to exemplary embodiments.
Figure 4:
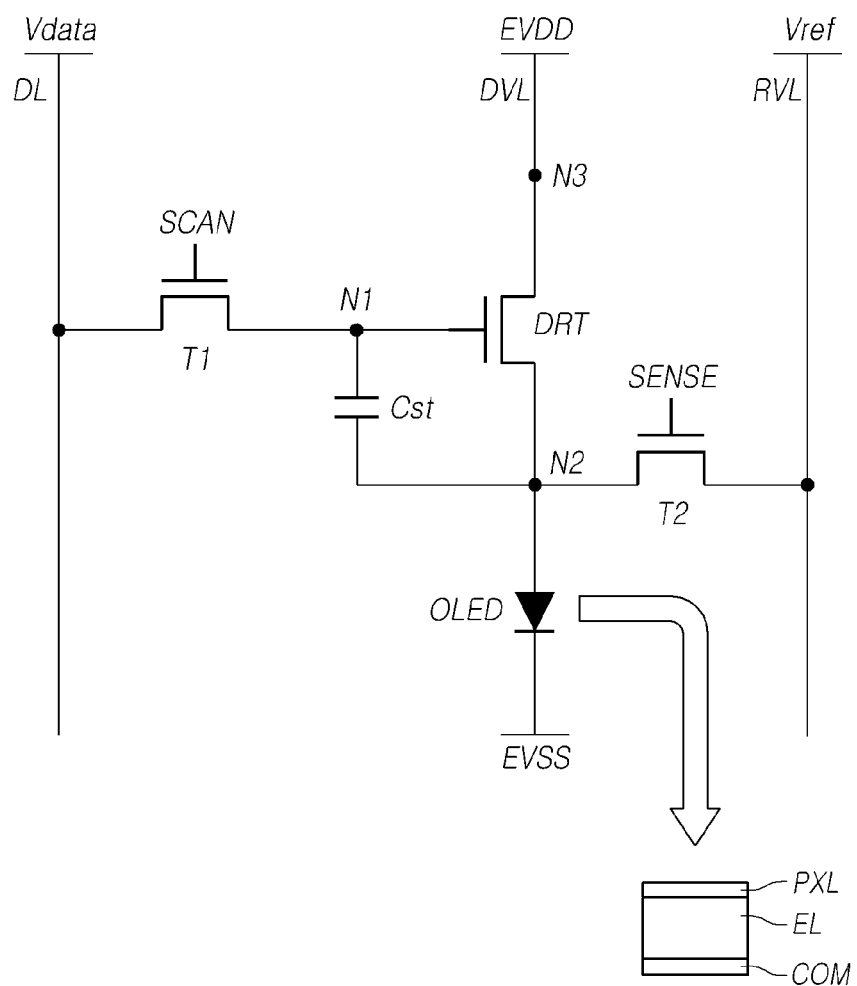
FIG. 4 illustrates another subpixel structure of the display device according to exemplary embodiments.

FIGS. 3 and 4 illustrate other subpixel structures of the display device 100 according to exemplary embodiments.

Referring to FIGS. 3 and 4, in a case in which the display device 100 according to exemplary embodiments is an organic light-emitting display device, each of the plurality of subpixels SP, arrayed in the display panel 110, can include an organic light-emitting diode OLED, a driving transistor DRT driving the organic light-emitting diode OLED, a first transistor T1 electrically connected between a first node N1 of the driving transistor DRT and a data line DL, a capacitor Cst electrically connected between the first node N1 and a second node N2 of the driving transistor DRT, etc.

The organic light-emitting diode OLED can include a pixel electrode PXL, an organic light-emitting layer EL, a common electrode COM, etc. The pixel electrode PXL can be an anode, while the common electrode COM can be a cathode. Alternatively, the pixel electrode PXL can be a cathode, while the common electrode COM can be an anode.

The pixel electrode PXL of the organic light-emitting diode OLED can be electrically connected to the second node N2 of the driving transistor DRT. A base voltage EVSS can be applied to the common electrode COM of the organic light-emitting diode OLED.

The driving transistor DRT drives the organic light-emitting diode OLED by supplying a driving current to the organic light-emitting diode OLED.

The driving transistor DRT includes the first node N1, the second node N2, a third node N3, and the like.

The first node N1 of the driving transistor DRT can be a node corresponding to a gate node, and can be electrically connected to a source node or a drain node of a first transistor T1.

The second node N2 of the driving transistor DRT can be electrically connected to the pixel electrode PXL of the organic light-emitting diode OLED, and can be a source node or a drain node.

The third node N3 of the driving transistor DRT can be a node, to which a driving voltage EVDD is applied, can be electrically connected to a driving voltage line DVL, through which the driving voltage EVDD is supplied, and can be a drain node or a source node.

The first transistor T1 can be on-off controlled by a first scan signal SCAN applied to the gate node thereof through the gate line.

The first transistor T1 can be turned on by the first scan signal SCAN to transfer the data voltage Vdata, supplied from the corresponding data line DL, to the first node N1 of the driving transistor DRT.

The capacitor Cst can be electrically connected between the first node N1 and the second node N2 of the driving transistor DRT to maintain the data voltage Vdata corresponding to a video signal voltage or a voltage corresponding to the data voltage Vdata during a one-frame period.

As described above, the subpixel SP illustrated in FIG. 2 can have a 2T1C structure comprised of the two transistors DRT and T1 and the single capacitor Cst in order to drive the light-emitting diode OLED.

The subpixel structure (i.e., the 2T1C structure) illustrated in FIG. 2 is provided for illustrative purposes only, and the present disclosure is not limited thereto. Rather, a single subpixel SP can further include one or more transistors or one or more capacitors, depending on the function, panel structure, etc.

FIG. 3 illustrates the 3T1C structure in which a single subpixel SP further includes a second transistor T2 electrically connected between the second node N2 of the driving transistor DRT and a reference voltage line RVL.

Referring to FIG. 3, the second transistor T2 can be electrically connected between the second node N2 of the driving transistor DRT and the reference voltage line RVL, so as to be on-off controlled by a second scan signal SENSE applied to a gate node thereof.

A drain node or a source node of the second transistor T2 can be electrically connected to the reference voltage line RVL, while the source node or the drain node of the second transistor T2 can be electrically connected to the second node N2 of the driving transistor DRT.

For example, the second transistor T2 can be turned on in a period of display driving, and can be turned off in a period of sensing driving in which characteristics of the driving transistor DRT or characteristics of the organic light-emitting diode OLED are detected.

The second transistor T2 can be turned on by the second scan signal SENSE in corresponding driving timing (e.g., display driving timing or voltage initialization timing in the period of sensing driving) to transfer a reference voltage Vref, supplied to the reference voltage line RVL, to the second node N2 of the driving transistor DRT.

In addition, the second transistor T2 can be turned on by the second scan signal SENSE at a corresponding driving time (e.g., a sampling time in the period during sensing driving) to transfer a voltage of the second node N2 of the driving transistor DRT to the reference voltage line RVL.

In other words, the second transistor T2 can control the voltage state of the second node N2 of the driving transistor DRT or transfer the voltage of the second node N2 of the driving transistor DRT to the reference voltage line RVL.

In addition, the capacitor Cst can be an external capacitor intentionally designed to be disposed externally of the driving transistor DRT, rather than a parasitic capacitor (e.g., Cgs or Cgd), i.e., an internal capacitor present between the first node N1 and the second node N2 of the driving transistor DRT.

Each of the driving transistor DRT, the first transistor T1, and the second transistor T2 can be an n-type transistor or a p-type transistor.

In addition, the first scan signal SCAN and the second scan signal SENSE can be separate gate signals. In this case, the first scan signal SCAN and the second scan signal SCAN2 can be applied to the gate node of the first transistor T1 and the gate node of the second transistor T2 through different gate lines, respectively.

In some cases, the first scan signal SCAN and the second scan signal SENSE can be the same gate signal. In this case, the first scan signal SCAN and the second scan signal SENSE can be commonly applied to the gate node of the first transistor T1 and the gate node of the second transistor T2 through the same gate line.

The subpixel structures illustrated in FIGS. 3 and 4 are presented for illustrative purposes only, and in some cases, one or more transistors or one or more capacitors can further be included.

Alternatively, the plurality of subpixels SP can have the same structure, or some subpixels among the plurality of subpixels SP can have a different structure from the remaining subpixels.

Although the display device 100 according to exemplary embodiments can be one of various types of display device, such as an organic light-emitting display device or an LCD device, the display device 100 according to exemplary embodiments will be described hereinafter as being an organic light-emitting display device, for the sake of brevity.

Figure 5:
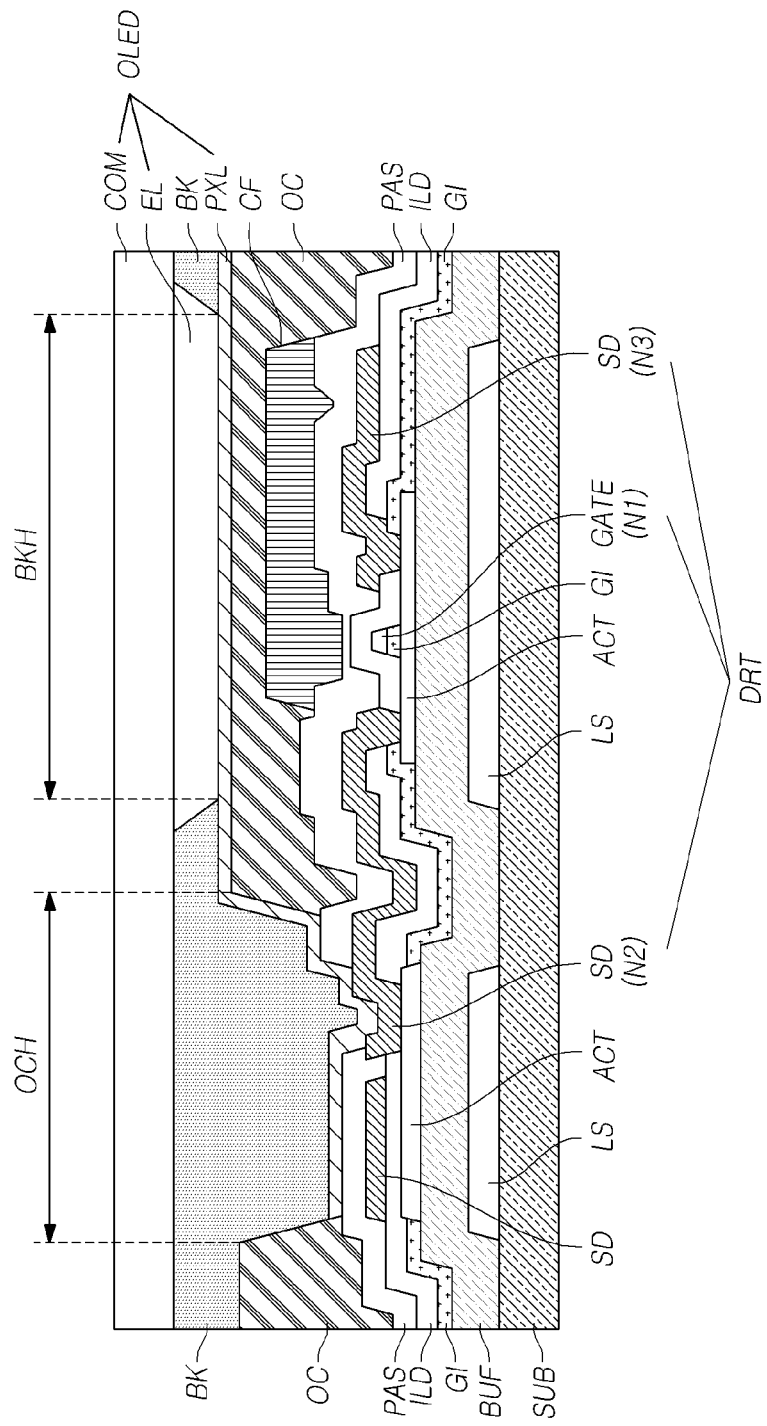
FIG. 5 is a cross-sectional view illustrating the display device according to exemplary embodiments.

FIG. 5 is a cross-sectional view illustrating the display device 100 according to exemplary embodiments. Here, FIG. 5 is a cross-sectional view illustrating a case in which the display device 100 is an organic light-emitting display device comprised of white organic light-emitting diodes OLED respectively including a color filter CF.

In addition, FIG. 5 is a cross-sectional view schematically illustrating an area of the single subpixel SP in FIG. 3 or 4, in which the organic light-emitting diode OLED and the driving transistor DRT are provided.

A shading layer LS can be disposed on a substrate SUB, and a buffer layer BUF can be disposed on the shading layer LS.

An active layer ACT can be located on the buffer layer BUF.

A gate insulating film GI can be located on the active layer ACT.

An gate electrode GATE serving as the gate node N1 of the driving transistor DRT can be located on the gate insulating film GI.

An interlayer insulating film ILD can cover the gate electrode GATE and the gate insulating film GI.

A source-drain material layer SD can be located on the interlay insulating film ILD.

A portion of the source-drain material layer SD can be a portion serving as the third node N3 of the driving transistor DRT. This portion can contact the active layer ACT through contact holes in the interlayer insulating film ILD and the gate insulating film GI.

Another portion of the source-drain material layer SD can be a portion serving as the second node N2 of the driving transistor DRT. This portion can contact the active layer ACT through contact holes of the interlayer insulating film ILD and the gate insulating film GI.

A portion of the active layer ACT in contact with the portion N3 of the source-drain material layer SD and a portion of the active layer ACT in contact with the other portion N2 of the source-drain material layer SD can be conducting portions (i.e., portions processed to be conductive), and the remaining portions of the active layer ACT can be portions on which channels of the driving transistor DRT are formed by a gate voltage applied to the gate electrode GATE.

A passivation layer PAS can be located on the source-drain material layer SD.

A color filter CF can be located on the passivation layer PAS, as required. In some cases, the color filer CF may not be provided. For example, in a case in which the organic light-emitting diode OLED is a WOLED (i.e., white OLED), a color filter CF, corresponding to the color of the corresponding subpixel SP, can be disposed below an overcoat layer OC.

The overcoat layer OC can be disposed on the color filter CR and the passivation layer PAS.

A pixel electrode PXL can be disposed on the overcoat layer OC.

The pixel electrode PXL can be in contact with the other portion N2 of the source-drain material layer SD through an opening OCH (also referred to as a hole, a contact hole, or an open area) and a hole in the passivation layer PAS.

A bank BK corresponding to a separation rib for defining an emission portion of the subpixel SP can be located on the overcoat layer OC. An open area BKH is defined by the bank BK to expose a portion of the pixel electrode PXL (corresponding to an emission area).

An organic light-emitting layer EL is located in the open area BKH of the bank BK, and a common electrode COM can be disposed on the organic light-emitting layer EL and the bank BK.

The display panel 110 according to exemplary embodiments can be a bottom emission display panel. In some cases, the display panel 110 according to exemplary embodiments can be a top emission display panel.

Figure 6:
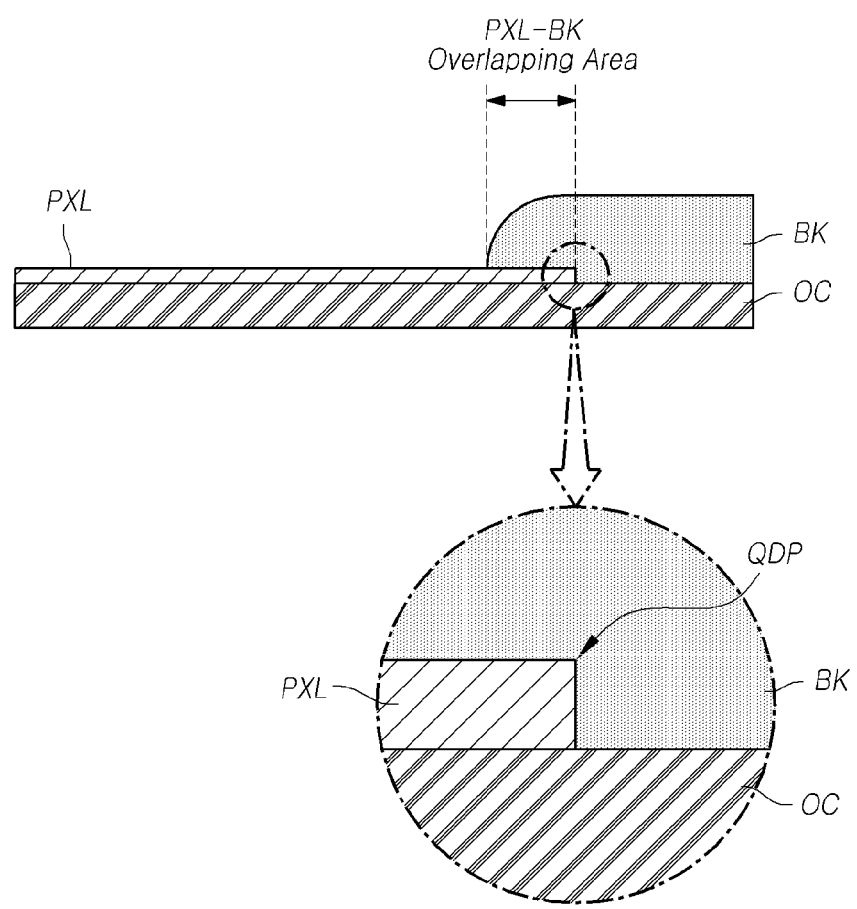
FIGS. 6 and 7 are cross-sectional views schematically illustrating a bank structure of the display device according to exemplary embodiments.
Figure 7:
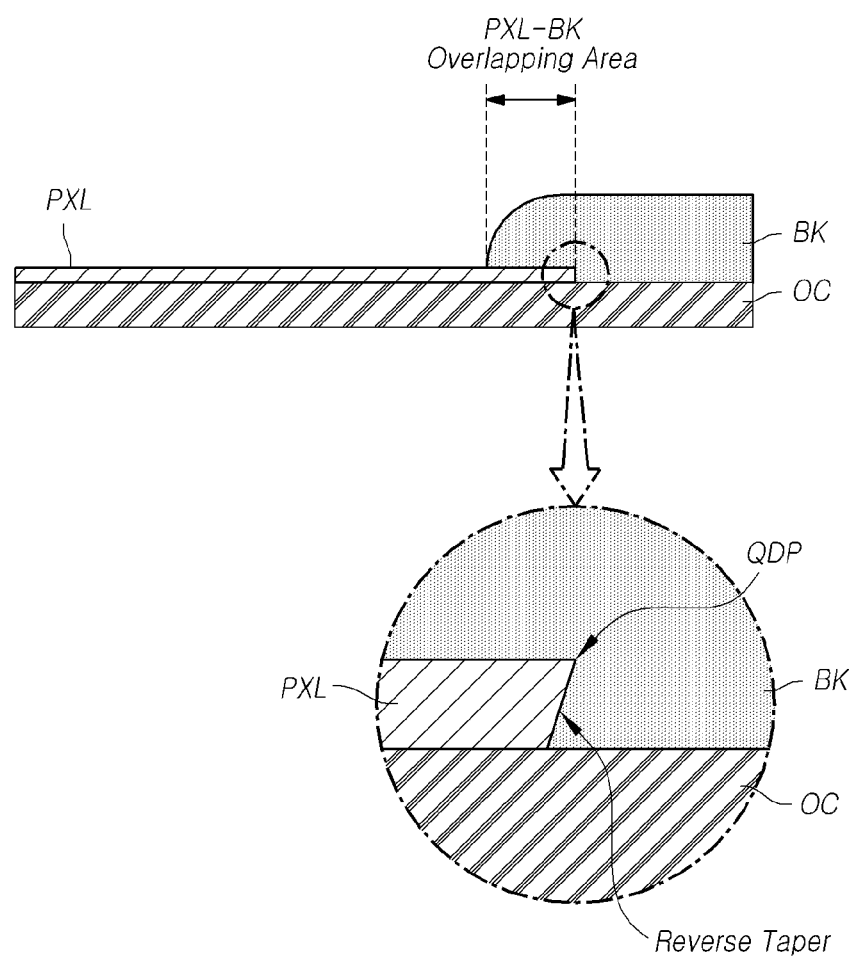
Figure 8:
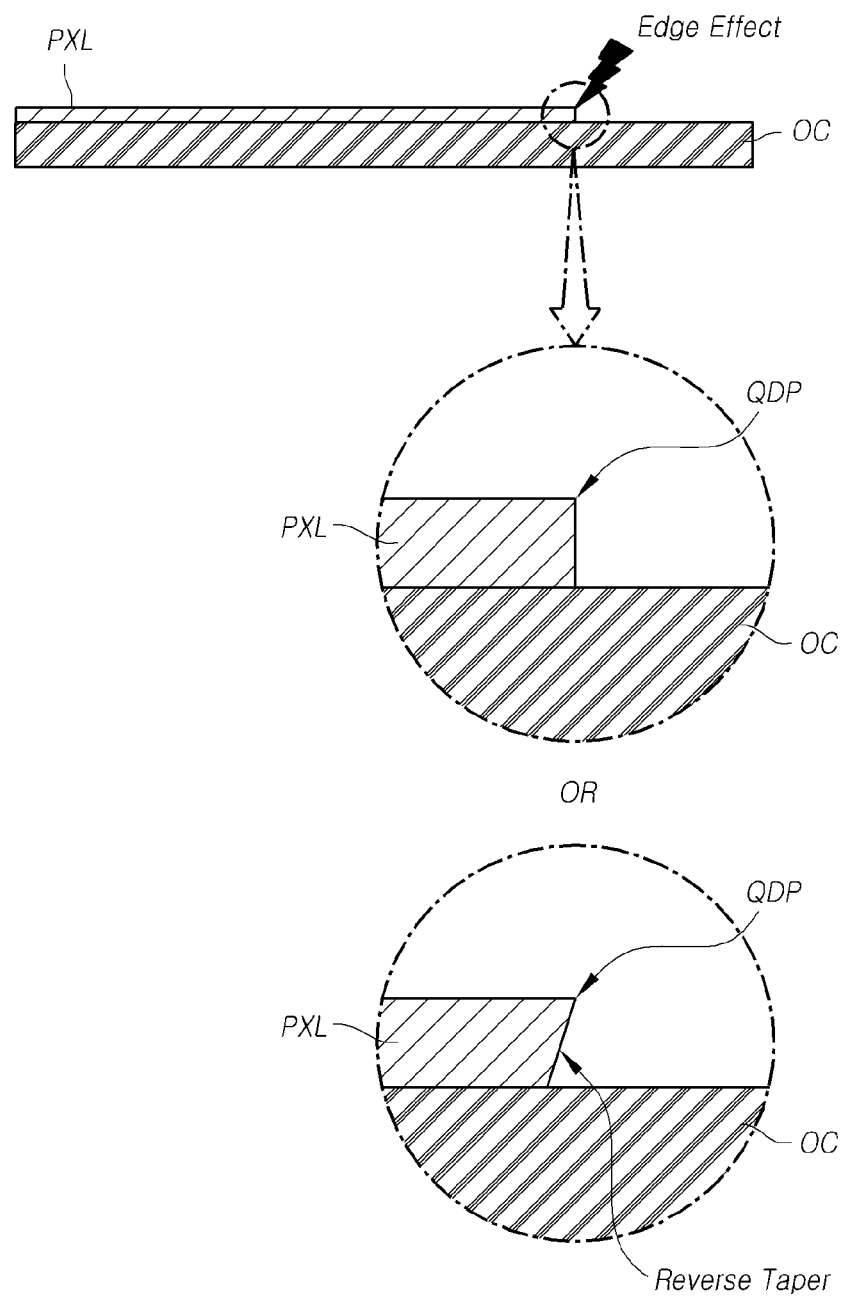
FIG. 8 is a cross-sectional view schematically illustrating a bankless structure of the display device according to exemplary embodiments.
Figure 9:
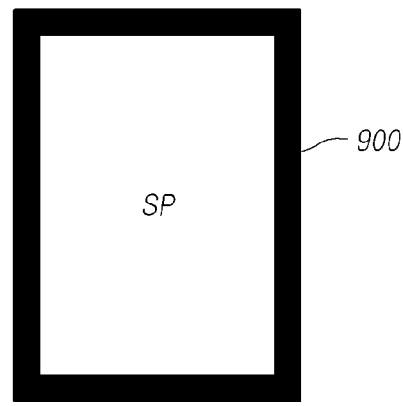
FIG. 9 illustrates an edge effect occurring in the bankless structure.

FIGS. 6 and 7 are cross-sectional views schematically illustrating a bank structure of the display device 100 according to exemplary embodiments, FIG. 8 is a cross-sectional view schematically illustrating a bankless structure of the display device 100 according to exemplary embodiments, and FIG. 9 illustrates an edge effect occurring in the bankless structure.

Referring to FIGS. 6 and 7, in the display device 100 according to exemplary embodiments including the bank BK as in FIG. 5, the bank BK can be disposed to surrounding and covering an edge portion of each of the pixel electrodes PXL. In other words, as illustrated in FIGS. 6 and 7, the edge portion of the pixel electrode PXL can overlap a portion of the bank BK.

The edge portion of the pixel electrode PXL can have the shape of a cut, as illustrated in FIG. 6, or the shape of a reverse taper, due to characteristics of panel processing, as illustrated in FIG. 7.

As illustrated in FIGS. 6 to 8, the edge portion of the pixel electrode PXL can have a portion QDP in which a larger amount of electric charges accumulate or concentrated. Regarding the shape, the edge portion of the pixel electrode PXL can have a pointed portion. Such a pointed portion can form the portion QDP in which a large amount of electric charges accumulate. In a case in which the edge portion of the pixel electrode PXL has the shape of a reverse taper due to the characteristics of panel processing, such accumulation of electric charges can be more significant.

Electric charges concentrated in the edge portion of the pixel electrode PXL can cause deterioration in the organic light-emitting layer EL. However, since the bank BK is disposed surrounding and covering the edge portion (i.e., the portion QDP in which electric charges accumulate) as illustrated in FIGS. 6 and 7, the edge portion (i.e., the portion QDP in which electric charges accumulate) of the pixel electrode PXL may not directly contact the organic light-emitting layer EL, thereby preventing deterioration in the organic light-emitting layer EL.

In this case, electric charges are concentrated in the edge portion of the pixel electrode PXL, and a portion of the organic light-emitting layer EL, corresponding to the edge portion of the pixel electrode PXL, is much more deteriorated. As illustrated in FIG. 9, the luminous intensity of a peripheral area 900 of the subpixel SP is reduced, which is referred to as an edge effect.

As illustrated in FIGS. 6 and 7, in a case in which the bank BK, disposed in the display panel 110 to define the emission portion of each of the subpixels SP, is shaped to surround and cover the edge portion of the pixel electrode PXL to reduce or prevent the edge effect, the edge effect can be reduced or prevented. However, the aperture ratio of the display panel 110 can be reduced by an amount equal to an overlapping area between the bank BK and the pixel electrode PXL, which is problematic.

In contrast, as illustrated in FIG. 8, in a case in which the display panel 110 is designed to have a bankless structure without the bank BK, the aperture ratio of the display panel 110 can be increased, but electric charges can be concentrated in the edge portion of the pixel electrode PXL.

In the bankless design of the display panel 110, the edge option of the pixel electrode PXL can be in direct contact with the organic light-emitting layer EL, such that electric charges concentrated in the edge portion of the edge portion of the pixel electrode PXL can more rapidly deteriorate the organic light-emitting layer EL. In other words, although the bankless design of the display panel 110 can increase the aperture ratio of the display panel 110, the peripheral area 900 of the subpixel SP can appear abnormally dark due to the increased edge effect.

Hereinafter, a structure able to reduce or prevent the edge effect while increasing the aperture ratio of the display panel will be described.

The bankless structure of the display device 100 according to exemplary embodiments, which will be described hereinafter, can also be referred to as a "full bankless structure" or a "complete bankless structure" in which no bank BK is present in the entirety of the boundary areas (i.e., the areas in which banks BK have been present) between subpixels SP.

Alternatively, the bankless structure of the display device 100 according to exemplary embodiments can be a "limited bankless structure" or a "partial bankless structure" (hereinafter, referred to as a "hybrid bankless structure") in which banks BK are absent in one or more areas while being present in other areas among the entirety of the boundary areas (i.e., the areas in which banks BK have been present) between subpixels SP.

Figure 10:
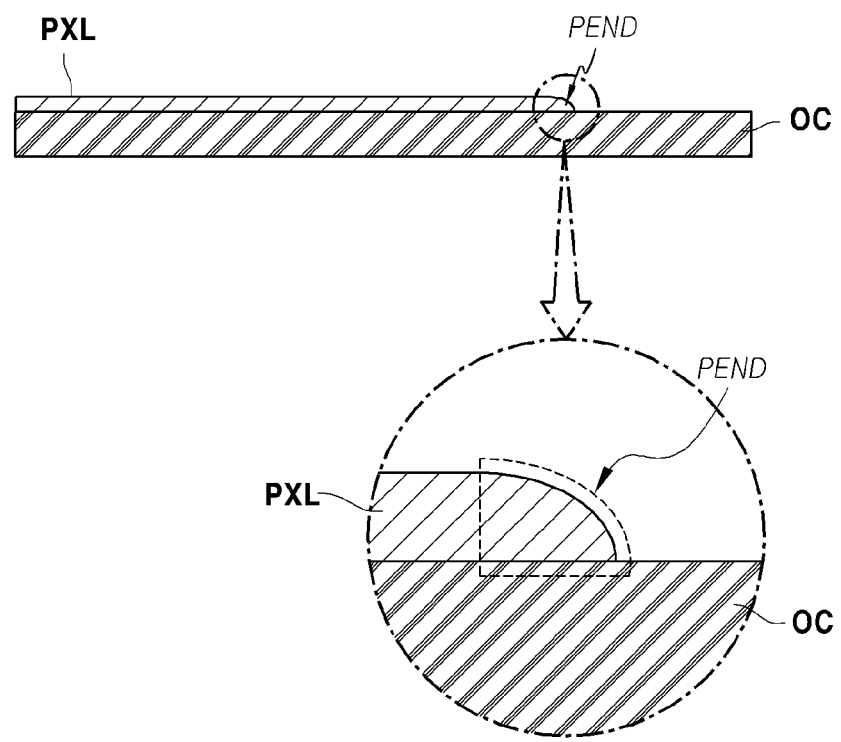
FIG. 10 is a cross-sectional view schematically illustrating the display panel, based on a first configuration scheme able to reduce or prevent an edge effect while improving the aperture ratio of the display panel, in the display device according to exemplary embodiments.

FIG. 10 is a cross-sectional view schematically illustrating the display panel 110, based on a first configuration scheme able to reduce or prevent an edge effect while improving the aperture ratio of the display panel 110, in the display device 100 according to exemplary embodiments.

Referring to FIG. 10, the display panel 110 according to exemplary embodiments can be designed on the basis of the first configuration scheme able to reduce or prevent an edge effect while improving the aperture ratio of the display panel 110.

According to the first configuration scheme, the banks BK covering the edge portion PEND of the pixel electrode PXL to increase the aperture ratio can be absent, and the edge portion PEND of the pixel electrode PXL can have a gentle shape without a pointed portion in order to reduce or prevent the edge effect. For example, the edge portion PEND of the pixel electrode PXL has a positively-tapered shape (which can be an opposite shape of a reverse taper) without a pointed portion or is rounded. According to this shape, the edge portion PEND of the pixel electrode PXL increases as being closer to the overcoat layer OC.

Due to the gentle shape of the edge portion PEND of the pixel electrode PXL, the accumulation of electric charges in the edge portion PEND of the pixel electrode PXL can be reduced.

Accordingly, the edge effect can be prevented or reduced, even in the case that the edge portion PEND of the pixel electrode PXL directly contacts the organic light-emitting layer EL due to the absence of the banks covering the edge portion PEND of the pixel electrode PXL.

Figure 11:
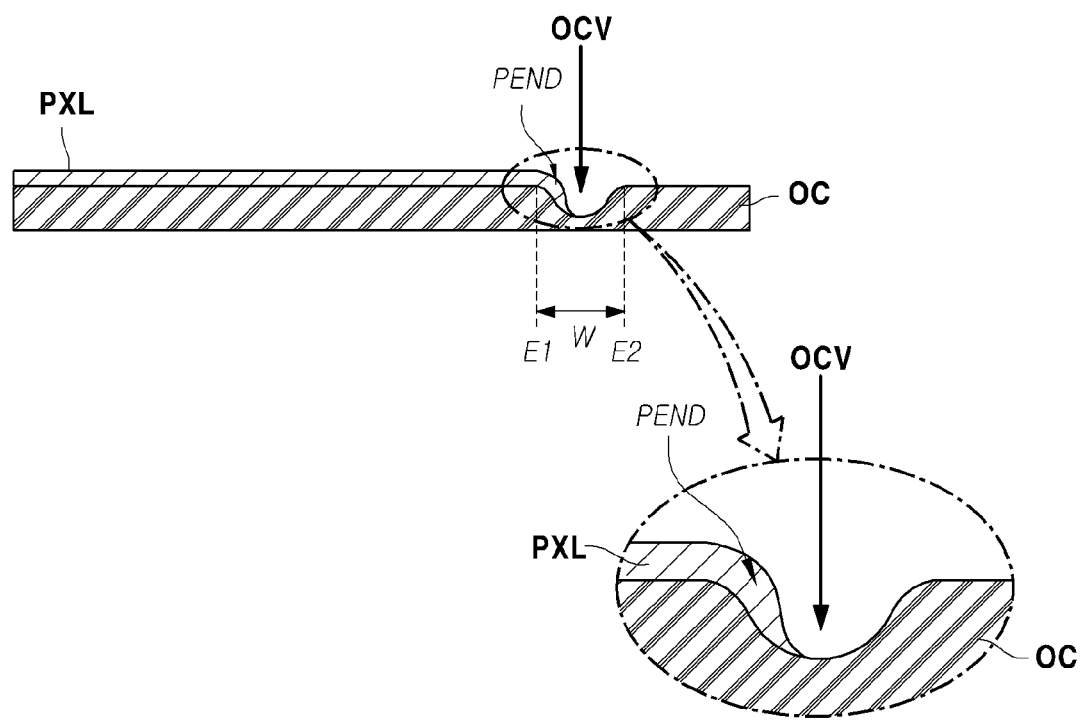
FIG. 11 is a cross-sectional view schematically illustrating the display panel, based on a second configuration scheme able to reduce or prevent an edge effect while improving the aperture ratio of the display panel, in the display device according to exemplary embodiments.

FIG. 11 is a cross-sectional view schematically illustrating the display panel 110, based on a second configuration scheme able to reduce or prevent an edge effect while improving the aperture ratio of the display panel 110, in the display device 100 according to exemplary embodiments.

Referring to FIG. 11, the display panel 110 according to exemplary embodiments can be designed on the basis of the second configuration scheme able to reduce or prevent an edge effect while improving the aperture ratio of the display panel 110.

According to the second configuration scheme, there are no banks BK covering the edge portion PEND of the pixel electrode PXL to improve the aperture ratio.

In addition, according to the second configuration scheme, the overcoat layer OC can have a recessed valley OCV. In the pixel electrode PXL disposed on the overcoat layer OC, a portion of the edge portion PEND can be curved or bent in a location adjacent to the valley OCV of the overcoat layer OC, such that the portion of the edge portion PEND is located on the valley OCV of the overcoat layer OC. This configuration can reduce or prevent the edge effect.

Referring to FIG. 11, an interval between both ends E1 and E2 of the valley OCV of the overcoat layer OC are referred to as a mouth. Here, the both ends E1 and E2 of the valley OCV are boundary points between flat portions and the valley OCV of the overcoat layer OC. The length of the interval between the both ends E1 and E2 of the valley OCV of the overcoat layer OC is referred to as a mouth width W.

Light emitted from the organic light-emitting layer EL, located on the pixel electrode PXL, can be totally-reflected between the pixel electrode PXL and the overcoat layer OC.

Such a phenomenon of total reflection can reduce the intensity of light in a viewing direction, thereby lowering luminous efficiency and leading to degraded image quality.

However, according to the second configuration scheme, even in the case that there is totally-reflected light below the pixel electrode PXL, the intensity of totally-reflected light below the edge portion PEND of the pixel electrode PXL, curved or bent onto the portion of the valley OCV of the overcoat layer OC, can be lower than the intensity of totally-reflected light below a flat portion of the pixel electrode PXL.

In other words, according to the second configuration scheme, total reflection of light is significantly reduced in an area adjacent to the valley OCV of the overcoat layer OC. Accordingly, intensity of light in the viewing direction can be increased, thereby improving luminous efficiency. For example, in the bottom emission structure, the viewing direction is a direction from the pixel electrode PXL to the overcoat layer OC.

Figure 12:
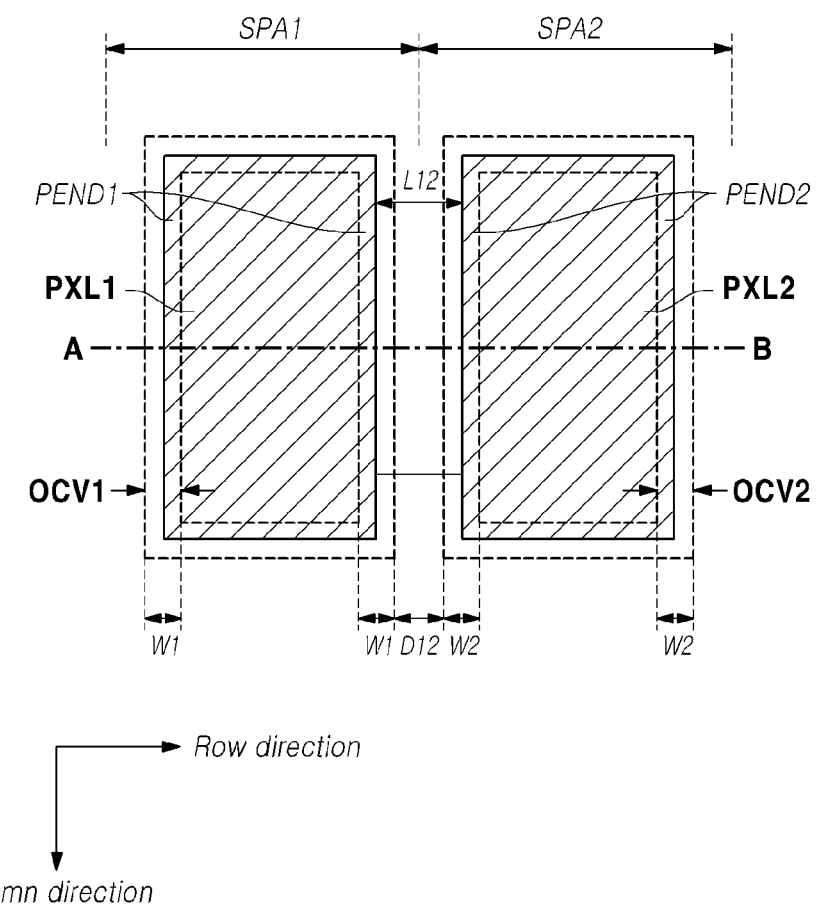
FIGS. 12 and 13 are a plan view and a cross-sectional view schematically illustrating a full bankless structure based on the second configuration scheme in the display device according to exemplary embodiments.
Figure 13:
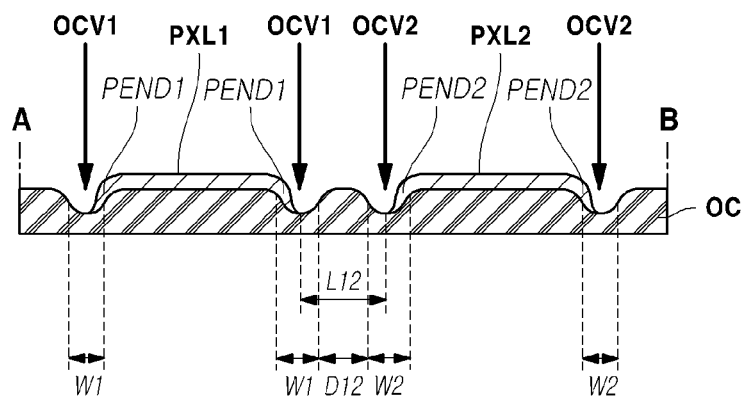

FIG. 12 is a plan view schematically illustrating a full bankless structure based on the second design scheme in the display device 100 according to exemplary embodiments, and FIG. 13 is a cross-sectional view taken along line A-B in FIG. 12.

In FIGS. 12 and 13, the structure in a first subpixel area SPA1 and a second subpixel area SPA2 is illustrated by way of example. This structure can be used in the entire area of the display panel 110.

Referring to FIG. 12, a first pixel electrode PXL1 can be located in the first subpixel area SPA1, while a second pixel electrode PXL2 can be located in the second subpixel area SPA2.

The first pixel electrode PXL1 and the second pixel electrode PXL2 are located on the overcoat layer OC to be spaced apart from each other.

In a case in which the display panel 110 is an organic light-emitting display panel, the first pixel electrode PXL1 can be an anode of the organic light-emitting diode OLED in the first subpixel, while the second pixel electrode PXL2 can be an anode of the organic light-emitting diode OLED in the second subpixel.

Referring to FIG. 13, the overcoat layer OC has a first valley OCV1 recessed in the first subpixel area SPA1. The overcoat layer OC has a second valley OCV2 recessed in the second subpixel area SPA2. That is, the valleys OCV1 and OCV2 of the overcoat layer OC can be present in the subpixel areas SPA1 and SPA2, respectively.

Referring to FIG. 12, the first valley OCV1 of the overcoat layer OC can be located along an outer boundary of the first pixel electrode PXL1, while the second valley OCV2 of the overcoat layer OC can be located along an outer boundary of the second pixel electrode PXL2.

Referring to FIG. 13, an edge portion PEND1 of the first pixel electrode PXL1 can be curved or bent to be located on a portion of the first valley OCV1 of the overcoat layer OC, while an edge portion PEND2 of the second pixel electrode PXL2 can be curved or bent to be located on a portion of the second valley OCV2 of the overcoat layer OC.

In the overcoat layer OC, the first valley OCV1 and the second valley OCV2 are spaced apart from each other.

In the overcoat layer OC, a mouth width W1 of the first valley OCV1 can be fixed regardless of the position or different depending on the position. A mouth width W1 of the second valley OCV2 can be fixed regardless of the position or different depending on the position.

In the overcoat layer OC, the mouth width W1 of the first valley OCV1 and the mouth width W1 of the second valley OCV2 can be the same or different.

The first pixel electrode PXL1 and the second pixel electrode PXL2 are disposed to be spaced apart from each other.

Although the shape of each of the first pixel electrode PXL1 and the second pixel electrode PXL2 is illustrated as being rectangular, this is merely for the sake of brevity. A shape other than the rectangular shape can be used, as required.

In addition, in FIG. 12, the first pixel electrode PXL1 and the second pixel electrode PXL2 are illustrated as having the same shape and the same size (area). However, this is merely for the sake of brevity, different shapes or different sizes (areas) can be used.

The distance L12 between the first pixel electrode PXL1 and the second pixel electrode PXL2 can be fixed regardless of the position or different depending on the position.

The distance D12 between the mouth of the first valley OCV1 of the overcoat layer OC and the mouth of the second valley OCV2 of the overcoat layer OC can be shorter than the distance L12 between the first pixel electrode PXL1 and the second pixel electrode PXL2 (D12<L12).

If the distance L12 between the first pixel electrode PXL1 and the second pixel electrode PXL2 is not fixed, or the distance D12 between the mouth of the first valley OCV1 and the mouth of the second valley OCV2 of the overcoat layer OC is not fixed, the maximum length D12 between the mouth of the first valley OCV1 and the mouth of the second valley OCV2 of the overcoat layer OC can be shorter than the distance L12 between the first pixel electrode PXL1 and the second pixel electrode PXL2 (D12<L12).

Referring to FIG. 13, since there is no bank BK covering the edge portion PEND1 of the first pixel electrode PXL1, the entire area of the first pixel electrode PXL1 can contact the organic light-emitting layer EL. Since there is no bank BK covering the edge portion PEND2 of the second pixel electrode PXL2, the entire area of the second pixel electrode PXL2 can contact the organic light-emitting layer EL.

Thus, the aperture ratio of each of the first subpixel area SPA1 and the second subpixel area SPA2 can be increased to a maximum size.

In addition, since the edge portion PEND1 of the first pixel electrode PXL1 is curved or bent to be located on a portion of the first valley OCV1 of the overcoat layer OC, the edge portion PEND1 of the first pixel electrode PXL1 has a gentle shape instead of a pointed shape. Accordingly, the edge effect due to the accumulation of electric charges can be reduced or prevented.

Likewise, since the edge portion PEND2 of the second pixel electrode PXL2 is curved or bent to be located on a portion of the second valley OCV2 of the overcoat layer OC, the edge portion PEND2 of the second pixel electrode PXL2 has a gentle shape instead of a pointed shape. Accordingly, the edge effect due to the accumulation of electric charges can be reduced or prevented.

In a case in which the valleys OCV1 and OCV2 of the overcoat layer OC are designed on the basis of the second design scheme to be present in the subpixel areas SPA1 and SPA2, respectively, and while surrounding the boundary areas of the pixel electrodes PXL1 and PXL2 in the subpixel areas SPA1 and SPA2, as illustrated in FIGS. 12 and 13, the display panel 110 according to exemplary embodiments can be a "full bankless display panel" in which no banks are present in the entirety of the boundary areas between the subpixels SP.

Figure 14:
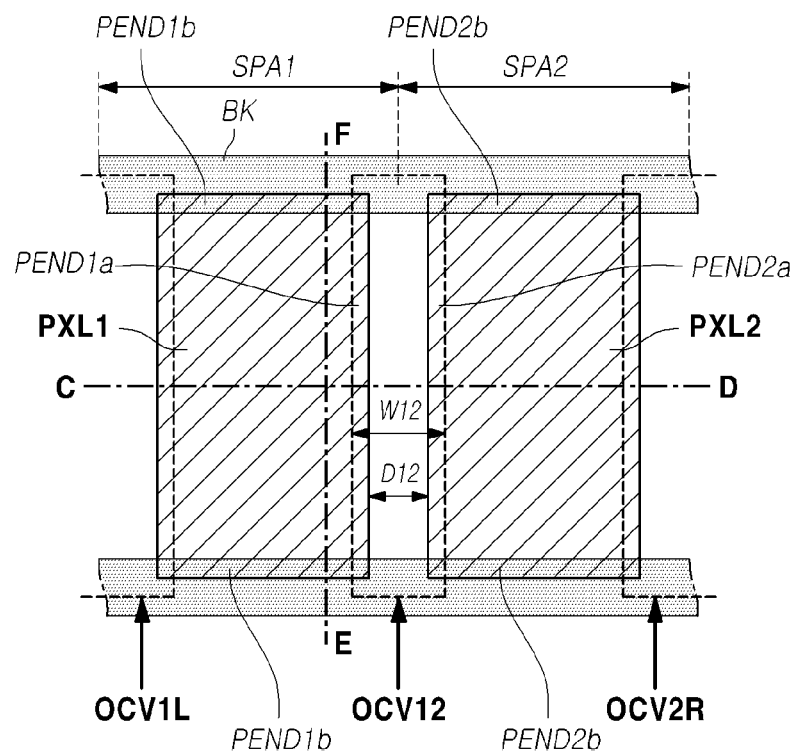
FIGS. 14, 15, and 16 are a plan view and cross-sectional views schematically illustrating a hybrid bankless structure in display device according to exemplary embodiments, in which the boundary areas between subpixels adjacent in a row direction are designed on the basis of the second configuration scheme.
Figure 15:
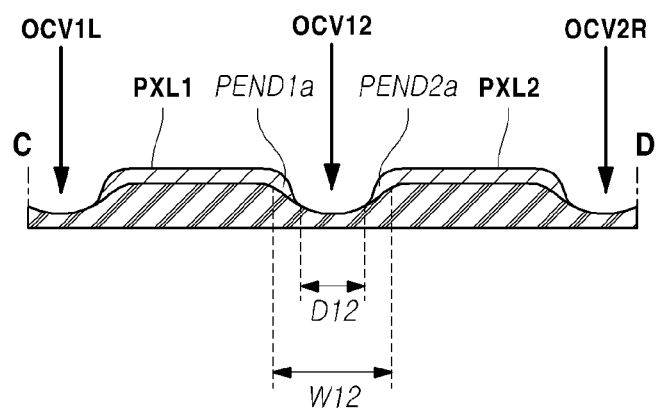
Figure 16:
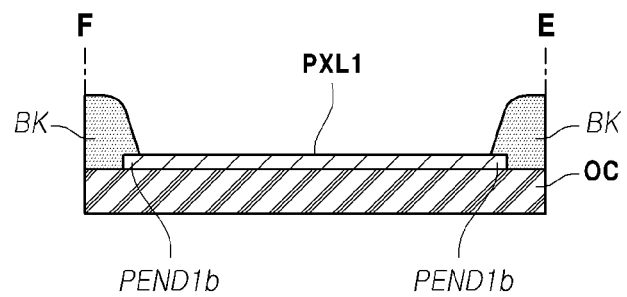

FIG. 14 is a plan view schematically illustrating a hybrid bankless structure in display device 100 according to exemplary embodiments, in which the boundary areas between subpixels adjacent in a row direction are designed on the basis of the second configuration scheme, FIG. 15 is a cross-sectional view taken along C-D line in FIG. 14, and FIG. 16 is a cross-sectional view taken along E-F line in FIG. 14.

In FIGS. 14 to 16, the structure in the first subpixel area SPA1 and the second subpixel area SPA2 is illustrated by way of example. This structure can be used in the entire area of the display panel 110.

Referring to FIG. 14, the first pixel electrode PXL1 can be located in the first subpixel area SPA1, while the second pixel electrode PXL2 can be located in the second subpixel area SPA2.

Referring to FIGS. 14 and 15, the first pixel electrode PXL1 and the second pixel electrode PXL2 are located on the overcoat layer OC to be spaced apart from each other in the row direction.

In a case in which the display panel 110 is an organic light-emitting display panel, the first pixel electrode PXL1 can be an anode of the organic light-emitting diode OLED in the first subpixel, while the second pixel electrode PXL2 can be an anode of the organic light-emitting diode OLED in the second subpixel.

Referring to FIGS. 14 and 15, a first valley OCV12 is recessed in the overcoat layer OC. An edge portion PEND1a of the first pixel electrode PXL1 can be curved or bent to be located on a portion of the first valley OCV12 of the overcoat layer OC.

Referring to FIGS. 14 and 15, the first valley OCV12 of the overcoat layer OC can be located between the edge portion PEND1a of the first pixel electrode PXL1 and an edge portion PEND2a of the second pixel electrode PXL2 facing the edge portion PEND1a. That is, the first valley OCV12 of the overcoat layer OC is present along the boundary area between the first subpixel area SPA1 and the second subpixel area SPA2.

Likewise, referring to FIGS. 14 and 15, in a case in which another subpixel area is located to the left of the first subpixel area SPA1, another valley OCV1L is present along the boundary area between the other subpixel area and the first subpixel area SPA1.

In addition, referring to FIGS. 14 and 15, in a case in which another subpixel area is present to the right of the second subpixel area SPA2, another valley OCV2R is present along the boundary area between the other subpixel area and the second subpixel area SPA2.

Referring to FIGS. 14 and 15, the edge portion PEND1a of the first pixel electrode PXL1 can be curved or bent to be located on a portion of the first valley OCV12 of the overcoat layer OC, and the edge portion PEND2a of the second pixel electrode PXL2 can be curved or bent to be located on another portion of the first valley OCV12 of the overcoat layer OC.

Referring to FIG. 15, since there is no bank BK covering the edge portion PEND1a of the first pixel electrode PXL1, the entire area of the first pixel electrode PXL1 can contact the corresponding organic light-emitting layer EL. Since there is no bank BK covering the edge portion PEND2a of the second pixel electrode PXL2, the entire area of the second pixel electrode PXL2 can contact the corresponding organic light-emitting layer EL.

Accordingly, the aperture ratio of the first subpixel area SPA1 and the aperture ratio of the second subpixel area SPA2 can be increased to maximum sizes.

In addition, since the edge portion PEND1a of the first pixel electrode PXL1 is curved or bent to be located on a portion of the first valley OCV12 of the overcoat layer OC and the edge portion PEND2a of the second pixel electrode PXL2 is curved or bent to be located on another portion of the first valley OCV12 of the overcoat layer OC, each of the edge portion PEND1a of the first pixel electrode PXL1 and the edge portion PEND2 of the second pixel electrode PXL2 can have a gentle shape instead of a pointed shape. Accordingly, the edge effect due to the accumulation of electric charges can be reduced or prevented.

Referring to FIGS. 14 and 15, the mouth width W12 of the first valley OCV12 of the overcoat layer OC can be greater than the distance D12 between the first pixel electrode PXL1 and the second pixel electrode PXL2.

The mouth width W12 of the first valley OCV12 of the overcoat layer OC, illustrated in FIGS. 14 and 15, is greater than the mouth width W1 of the single valley OCV1 of the overcoat layer OC, illustrated in FIGS. 12 and 13.

Since the valley OCV12 of the overcoat layer OC, illustrated in FIGS. 14 and 15, is recessed to be wider than the single valley OCV1 of the overcoat layer OC, illustrated in FIGS. 12 and 13, as described above, the valley OCV12 can be more easily formed.

In addition, since the valleys of the overcoat layer OC are formed along the boundary areas of the adjacent subpixels according to the structure illustrated in FIGS. 14 and 15, the number of the valleys in the structure illustrated in FIGS. 14 and 15 can be smaller than the number of the valleys in the structure illustrated in FIGS. 12 and 13.

The edge portion PEND1a of the first pixel electrode PXL1, curved or bent on the first valley OCV12 of the overcoat layer OC, faces the edge portion PEND2a of the second pixel electrode PXL2 curved or bent on the first valley OCV12 of the overcoat layer OC.

Another edge portion PEND1b of the first pixel electrode PXL1 and another edge portion PEND2b of the second pixel electrode PXL2 can be located parallel to each other.

Banks BK can be located on the other edge portion PEND1b of the first pixel electrode PXL1 and the other edge portion PEND2b of the second pixel electrode PXL2. Thus, even in the case that the aperture ratio is partially reduced, the edge effect in the other edge portion PEND1b of the first pixel electrode PXL1 and the other edge portion PEND2b of the second pixel electrode PXL2 can be prevented.

A transistor (e.g., the transistor illustrated in FIGS. 2 to 4), electrically connected to the first pixel electrode PXL1 or the second pixel electrode PXL2, can be located below the overcoat layer OC in an area in which the bank BK is located. The source or drain of the transistor can be electrically connected to the first pixel electrode PXL1 or the second pixel electrode PXL2 through a hole in the overcoat layer OC.

The valley OCV12 of the overcoat layer OC can be present in the boundary area between the first subpixel area SPA1 and the second subpixel area SPA2, adjacent to each other in the row direction, banks BK can be present in the boundary area of the first subpixel area SPA1 in the column direction and the boundary area of the second subpixel area SPA2 in the column direction, and circuit components (e.g., transistors) connected to the pixel electrodes PXL1 and PX2 can be disposed in these areas.

Figure 17:
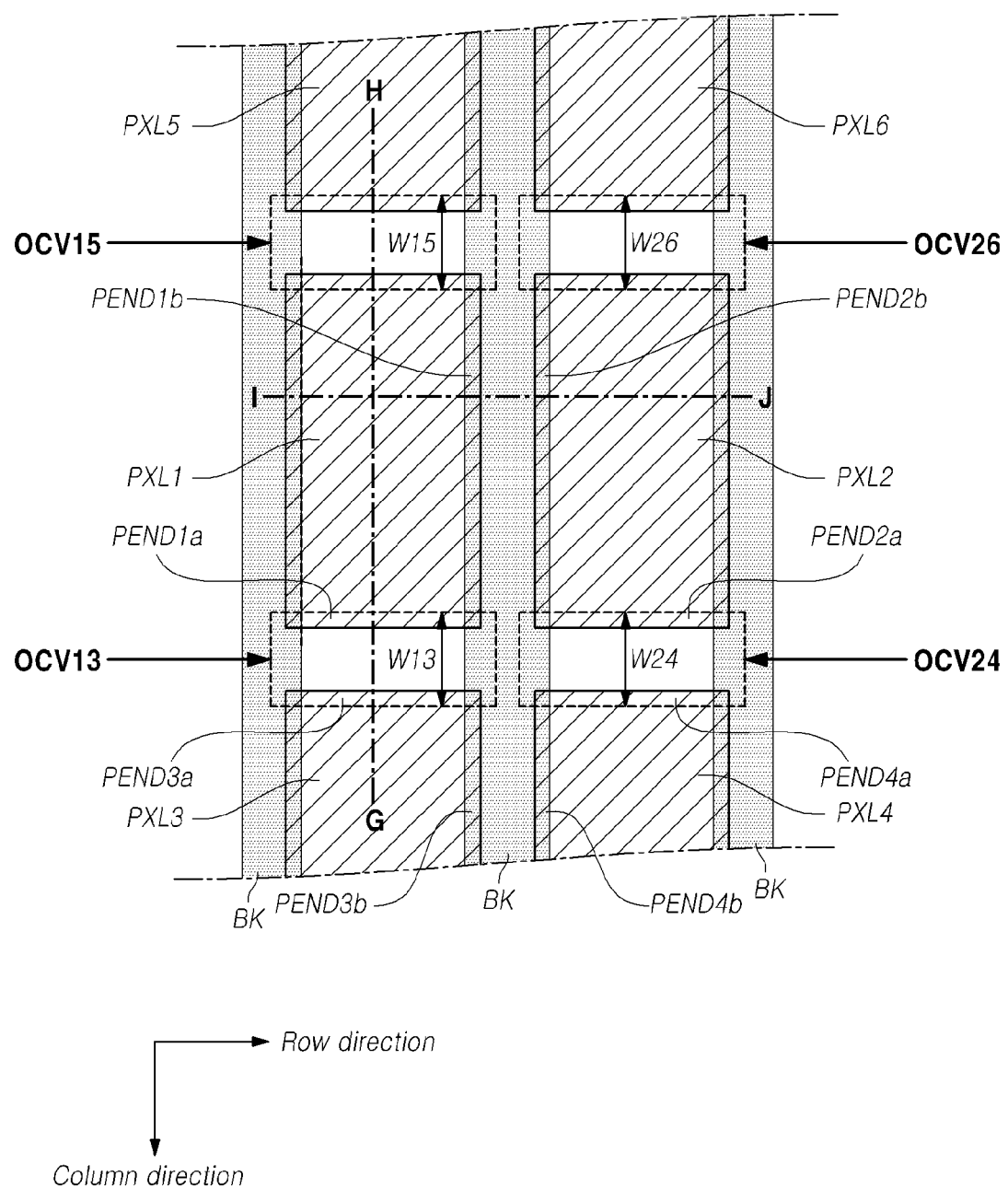
FIGS. 17, 18, and 19 are a plan view and cross-sectional views schematically illustrating a hybrid bankless structure based on the second configuration scheme in the display device according to exemplary embodiments, the hybrid bankless structure being used in boundary areas between subpixels adjacent in the column direction.
Figure 18:
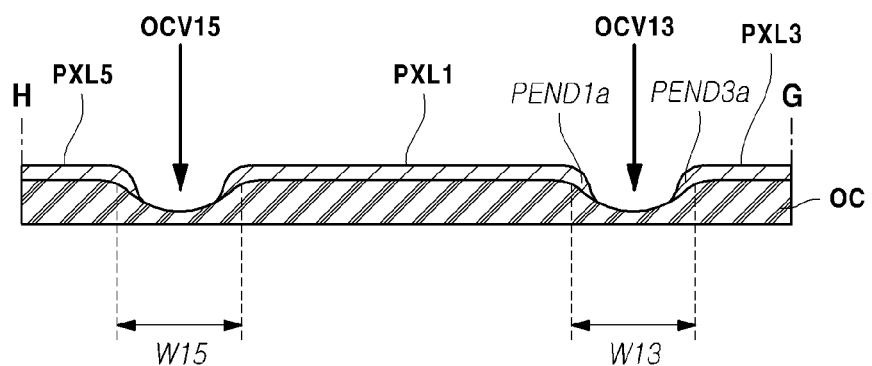
Figure 19:
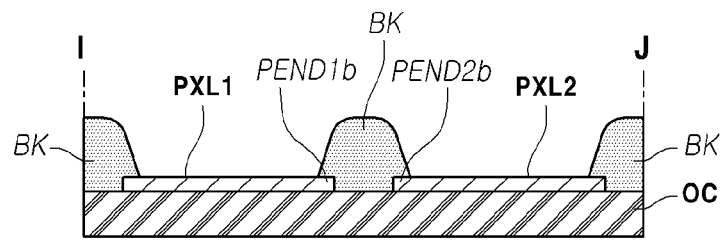

FIG. 17 is a plan view schematically illustrating a hybrid bankless structure based on the second configuration scheme in the display device 100 according to exemplary embodiments, the hybrid bankless structure being used in boundary areas between subpixels adjacent in the column direction, FIG. 18 is a cross-sectional view taken along line G-H in FIG. 17, and FIG. 19 is a cross-sectional view taken along line I-J in FIG. 17.

FIG. 17 is a plan view illustrating six (6) subpixel areas, in which six pixel electrodes PXL1 to PXL6 are disposed.

Among the 6 pixel electrodes PXL1 to PXL6, the fifth pixel electrode PXL5, the first pixel electrode PXL1, and the third pixel electrode PXL3 can be disposed in the same column to adjoin each other. That is, no circuit components (e.g., transistors and capacitors) are disposed between the fifth pixel electrode PXL5 and the first pixel electrode PXL1, and no circuit components (e.g., transistors and capacitors) are disposed between the first pixel electrode PXL1 and the third pixel electrode PXL3.

Likewise, the sixth pixel electrode PXL6, the second pixel electrode PXL2, and the fourth pixel electrode PXL4 can be disposed in the same column to adjoin each other. That is, no circuit components (e.g., transistors and capacitors) are disposed between the sixth pixel electrode PXL6 the second pixel electrode PXL2, and no circuit components (e.g., transistors and capacitors) are disposed between the second pixel electrode PXL2 and the fourth pixel electrode PXL4.

Referring to FIGS. 17 and 18, a valley OCV15 of the overcoat layer OC can be disposed along edge portions of pixel electrodes adjacent in the column direction, i.e., an edge portion of the fifth pixel electrode PXL5 and an edge portion of the first pixel electrode PXL1. The mouth width W15 of the valley OCV15 is greater than the distance between the fifth pixel electrode PXL5 and the first pixel electrode PXL1. In addition, the edge portion of the fifth pixel electrode PXL5 and the edge portion of the first pixel electrode PXL1 can be curved or bent to be located on the valley OCV15 of the overcoat layer OC.

Referring to FIGS. 17 and 18, a valley OCV13 of the overcoat layer OC can be disposed along edge portions of pixel electrodes adjacent in the column direction, i.e., the edge portion PEND1a of the first pixel electrode PXL1 and an edge portion PEND3a of the third pixel electrode PXL3. The mouth width W13 of the valley OCV13 is greater than the distance between the first pixel electrode PXL1 and the third pixel electrode PXL3. In addition, the edge portion PEND1a of the first pixel electrode PXL1 and the edge portion PEND3a of the third pixel electrode PXL3 can be curved or bent to be located on the valley OCV13 of the overcoat layer OC.

As illustrated in FIG. 18, none of edge portions of the fifth pixel electrode PXL5, the first pixel electrode PXL1, and the third pixel electrode PXL3, facing each other, are covered with banks BK. Thus, maximum areas of the fifth pixel electrode PXL5, the first pixel electrode PXL1, and the third pixel electrode PXL3 can be exposed, instead of being covered with the banks BK. That is, the aperture ratio can be maximized.

Referring to FIG. 17, a valley OCV26 of the overcoat layer OC can be disposed along edge portions of pixel electrodes adjacent in the column direction, i.e., an edge portion of the sixth pixel electrode PXL6 and an edge portion of the second pixel electrode PXL2. The mouth width W26 of the valley OCV26 is greater than the distance between the sixth pixel electrode PXL6 and the second pixel electrode PXL2. In addition, the edge portion of the sixth pixel electrode PXL6 and the edge portion of the second pixel electrode PXL2 can be curved or bent to be located on the valley OCV26 of the overcoat layer OC.

Referring to FIG. 17, a valley OCV24 of the overcoat layer OC can be disposed along edge portions of pixel electrodes adjacent in the column direction, i.e., the edge portion PEND2*a* of the second pixel electrode PXL2 and the edge portion PEND4*a* of the fourth pixel electrode PXL4. The mouth width W24 of the valley OCV24 is greater than the distance between the second pixel electrode PXL2 and the fourth pixel electrode PXL4. In addition, the edge portion PEND2*a* of the second pixel electrode PXL2 and the edge portion PEND4*a* of the fourth pixel electrode PXL4 can be curved or bent to be located on the valley OCV26 of the overcoat layer OC.

Since none of the facing edge portions of the sixth pixel electrode PXL6, the second pixel electrode PXL2, and the fourth pixel electrode PXL4 are covered with the banks BK, the maximum areas of the sixth pixel electrode PXL6, the second pixel electrode PXL2, and the fourth pixel electrode PXL4 can be exposed. That is, the aperture ratio can be maximized.

In addition, referring to FIG. 17, the fifth pixel electrode PXL5 and the sixth pixel electrode PXL6 can be disposed adjacent in the row direction, with circuit components being disposed therebetween. The first pixel electrode PXL1 and the second pixel electrode PXL2 can be disposed adjacent in the row direction, with circuit components being disposed therebetween. The third pixel electrode PXL3 and the fourth pixel electrode PXL4 can be disposed adjacent in the row direction, with circuit components being disposed therebetween.

Referring to FIGS. 17 and 19, the other edge portion PEND1*b* of the first pixel electrode PXL1 and the other edge portion PEND2*b* of the second pixel electrode PXL2 are covered with the banks BK.

Likewise, the other edge portion of the fifth pixel electrode PXL5 and the other edge portion of the sixth pixel electrode PXL6 are covered with the banks BK. The other edge portion PEND3*b* of the third pixel electrode PXL3 and the other edge portion PEND4*b* of the fourth pixel electrode PXL4 are covered with the banks BK.

Describing again with reference to FIGS. 17 to 19, the first pixel electrode PXL1 and the third pixel electrode PXL3 can be adjacently disposed on the overcoat layer OC to be spaced apart from each other in the column direction.

The valley OCV13 can be present in the area (boundary area) between the first pixel electrode PXL1 and the third pixel electrode PXL3 adjacent in the column direction. That is, the valley OCV13 of the overcoat layer OC can be located between the edge portion PEND1*a* of the first pixel electrode PXL1 and the edge portion PEND3*a* of the third pixel electrode PXL3.

The edge portion PEND1*a* of the first pixel electrode PXL1 can be curved or bent to be located on a portion of the valley OCV13 of the overcoat layer OC. The edge portion PEND3*a* of the third pixel electrode PXL3 can be curved or bent to be located on another portion of the same valley OCV13 of the overcoat layer OC.

The valley OCV13 of the overcoat layer OC, overlapping the edge portion PEND1*a* of the first pixel electrode PXL1 and the edge portion PEND3*a* of the third pixel electrode PXL3, has a predetermined width W13. The mouth width W13 of the valley OCV13 is greater than the distance between the first pixel electrode PXL1 and the third pixel electrode PXL3.

The edge portion PEND1*a* of the first pixel electrode PXL1 and the edge portion PEND3*a* of the third pixel electrode PXL3, curved or bent to be located on a portion and another portion of the valley OCV13 of the overcoat layer OC, respectively, face each other.

The other edge portion PEND1*b* of the first pixel electrode PXL1 and the other edge portion PEND3*b* of the third pixel electrode PXL3 can be located parallel to each other.

The banks BK can be located on the other edge portion PEND1*b* of the first pixel electrode PXL1 and the other edge portion PEND3*b* of the third pixel electrode PXL3.

The transistors (TR in FIG. 2 or DRT in FIGS. 3 and 4), electrically connected to the first pixel electrode PXL1 or the third pixel electrode PXL3, can be located below the overcoat layer OC, in areas in which the banks BK are located.

The source or drain of each of the transistors can be electrically connected to the first pixel electrode PXL1 or the third pixel electrode PXL3 through the hole or opening (OCH in FIG. 5) in the overcoat layer OC.

According to the structure described above with reference to FIGS. 17 to 19, it is possible to prevent eh edge effect while increasing the aperture ratio.

Figure 20:
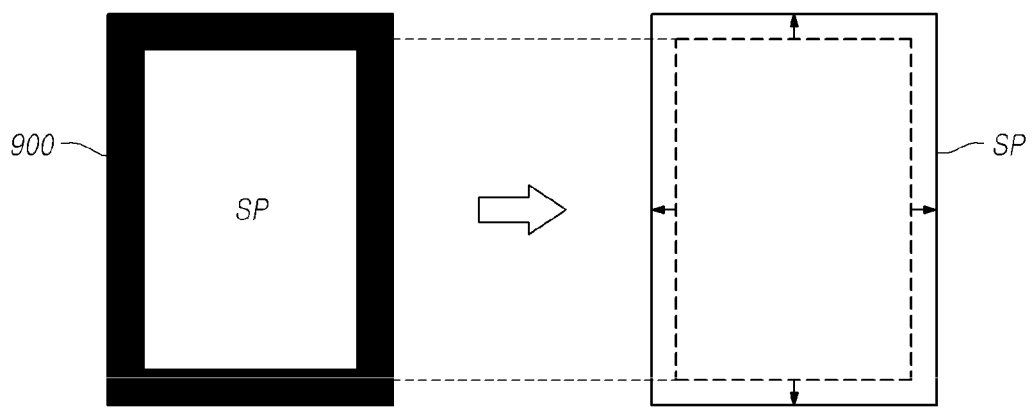
FIG. 20 schematically illustrates the prevention of the edge effect in the display device according to exemplary embodiments, in which the display panel is designed on the basis of the first or second configuration scheme able to reduce or prevent the edge effect while increasing the aperture ratio.

FIG. 20 schematically illustrates the prevention of the edge effect in the display device 100 according to exemplary embodiments, in which the display panel 110 is designed on the basis of the first or second configuration scheme able to reduce or prevent the edge effect while increasing the aperture ratio.

Referring to FIG. 20, in a case in which the display panel 110 is fabricated on the basis of the above-described first or second configuration scheme, a phenomenon (i.e., edge effect), in which the peripheral area 900 of each of the subpixels SP appears abnormally black due to the typical bankless structure as illustrated in FIG. 9, can occur. That is, the edge effect, in which the surrounding areas of the edge portions of the pixel electrodes PXL appear abnormally black, can be prevented.

In addition, in the display panel 110 designed on the basis of the above-described first or second configuration scheme, the aperture ratio of the pixel electrodes PXL can be increased, and thus, the emission area of the subpixels SP can be further increased, compared to FIG. 9.

As set forth above, according to exemplary embodiments, the display device 100 has a structure able to efficiently increase the aperture ratio of the display device 100.

According to exemplary embodiments, the display device 100 has a structure able to prevent an image abnormality in an edge portion of a pixel electrode (i.e., an edge effect), while increasing the aperture ratio of the display device 100.

According to exemplary embodiments, the display device 100 has a full bankless structure able to prevent an image abnormality in an edge portion of a pixel electrode (i.e., an edge effect), while increasing the aperture ratio of the display device.

According to exemplary embodiments, the display device 100 has a hybrid bankless structure able to prevent an image abnormality in an edge portion of a pixel electrode (i.e., an edge effect), while increasing the aperture ratio of the display device.

According to exemplary embodiments, the display device 100 has a structure able to improve luminous efficiency by reducing unnecessary total internal reflection of light.

The foregoing descriptions and the accompanying drawings have been presented in order to explain certain principles of the present disclosure by way of example. A person having ordinary skill in the art to which the present disclosure relates could make various modifications and variations by combining, dividing, substituting for, or changing the elements without departing from the principle of the present disclosure. The foregoing embodiments disclosed herein shall be interpreted as being illustrative, while not being limitative, of the principle and scope of the present disclo-

What is claimed is:

1. A display device comprising:
an overcoat layer disposed on a substrate;
a first pixel electrode disposed on the overcoat layer; and
a second pixel electrode disposed on the overcoat layer and spaced apart from the first pixel electrode,
wherein the first pixel electrode is located in an area of a first subpixel,
the overcoat layer comprises a recessed first valley and a recessed second valley,
the recessed second valley being spaced apart from the recessed first valley,
an edge portion of the first pixel electrode comprises a curved or bent portion located on a portion of the recessed first valley of the overcoat layer, and
an edge portion of the second pixel electrode comprises a curved or bent portion located on a portion of the recessed second valley of the overcoat layer.

2. The display device according to claim 1, wherein a distance between a mouth of the recessed first valley of the overcoat layer and a mouth of the recessed second valley of the overcoat layer is shorter than a distance between the first pixel electrode and the second pixel electrode.

3. The display device according to claim 1, wherein the recessed first valley of the overcoat layer is located along an outer boundary of the first pixel electrode, and
the recessed second valley of the overcoat layer is located along an outer boundary of the second pixel electrode.

4. The display device according to claim 1, wherein an entire area of each of the first pixel electrode and the second pixel electrode is in contact with a corresponding organic light-emitting layer.

5. The display device according to claim 1, wherein the second pixel electrode disposed on the overcoat layer to be spaced apart from the first pixel electrode in a row direction,
wherein the recessed first valley of the overcoat layer is located between the edge portion of the first pixel electrode and an edge portion of the second pixel electrode,
a width of a mouth of the recessed first valley of the overcoat layer is greater than a distance between the first pixel electrode and the second pixel electrode, and
the edge portion of the second pixel electrode comprises a curved or bent portion located on another portion of the recessed first valley of the overcoat layer.

6. The display device according to claim 5, wherein the edge portion of the first pixel electrode and the edge portion of the second pixel electrode face each other, and
another edge portion of the first pixel electrode and another portion of the second pixel electrode are located parallel to each other, and
the display device further comprises a bank located on the other edge portion of the first pixel electrode and the other edge portion of the second pixel electrode.

7. The display device according to claim 6, further comprising a transistor electrically connected to the first pixel electrode or the second pixel electrode and located below the overcoat layer, in an area in which the bank is located,
wherein a source or a drain of the transistor is electrically connected to the first pixel electrode or the second pixel electrode through a hole in the overcoat layer.

8. The display device according to claim 1, further comprising a third pixel electrode disposed on the overcoat layer to be spaced apart from the first pixel electrode in a column direction,
wherein the recessed first valley of the overcoat layer is located between the edge portion of the first pixel electrode and an edge portion of the third pixel electrode,
a width of a mouth of the recessed first valley of the overcoat layer is greater than a distance between the first pixel electrode and the third pixel electrode, and
the edge portion of the third pixel electrode comprises a curved or bent portion located on another portion of the recessed first valley of the overcoat layer.

9. The display device according to claim 8, wherein the edge portion of the first pixel electrode and the edge portion of the third pixel electrode face each other, and
another edge portion of the first pixel electrode and another portion of the third pixel electrode are located parallel to each other, and
the display device further comprises a bank located on the other edge portion of the first pixel electrode and the other edge portion of the third pixel electrode.

10. The display device according to claim 9, further comprising a transistor electrically connected to the first pixel electrode or the third pixel electrode and located below the overcoat layer, in an area in which the bank is located,
wherein a source or a drain of the transistor is electrically connected to the first pixel electrode or the third pixel electrode through a hole in the overcoat layer.

11. The display device according to claim 1, further comprising a color filter disposed below the overcoat layer, the color filter corresponding to a color of the first subpixel.

12. The display device according to claim 1, wherein totally-reflected light is present below the first pixel electrode, and
an intensity of the totally-reflected light, present below the curved or bent portion of the first pixel electrode on the portion of the recessed first valley, is lower than an intensity of the totally-reflected light, present below a flat portion of the first pixel electrode.

13. A display device comprising:
an overcoat layer disposed on a substrate;
a first pixel electrode disposed on the overcoat layer; and
an organic light-emitting layer disposed on the first pixel electrode,
wherein the first pixel electrode is located in an area of a first subpixel,
an edge portion of the first pixel electrode has a positively tapered and gentle shape without a pointed portion, and
the edge portion of the first pixel electrode is in contact with the organic light-emitting layer.

* * * * *